United States Patent
Lee et al.

(10) Patent No.: US 7,564,301 B2
(45) Date of Patent: Jul. 21, 2009

(54) APPARATUS FOR ADJUSTING FREQUENCY CHARACTERISTIC AND Q FACTOR OF LOW PASS FILTER AND METHOD THEREOF

(75) Inventors: Seung-Sik Lee, Daejon (KR);
Bong-Hyuk Park, Daejon (KR);
Chang-Wan Kim, Daejon (KR);
Sang-Sung Choi, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/927,904

(22) Filed: Oct. 30, 2007

(65) Prior Publication Data

US 2008/0106329 A1    May 8, 2008

(30) Foreign Application Priority Data

Nov. 2, 2006    (KR) ...................... 10-2006-0107884

(51) Int. Cl.
*H03K 5/00* (2006.01)
(52) U.S. Cl. ...................... 327/558; 327/553
(58) Field of Classification Search .......... 327/551–559
See application file for complete search history.

(56) References Cited

U.S. PATENT DOCUMENTS

| | | | |
|---|---|---|---|
| 5,028,884 A * | 7/1991 | Kondo et al. ................ | 330/305 |
| 5,608,665 A | 3/1997 | Wyszynski | |
| 5,774,027 A | 6/1998 | Yamamoto | |
| 6,408,010 B1 * | 6/2002 | Stroet ......................... | 370/503 |
| 6,538,498 B2 * | 3/2003 | Lee et al. .................... | 327/553 |
| 6,930,565 B1 * | 8/2005 | Vishinsky .................. | 333/17.1 |

FOREIGN PATENT DOCUMENTS

| KR | 1020040022604 | 3/2004 |
|---|---|---|
| KR | 1020060080848 | 7/2006 |

OTHER PUBLICATIONS

Korean Notice of Patent Grant dated Oct. 25, 2007 for the corresponding application KR 10-2006-0107884.
G. Zatorre, et al; "Tuning System for CMOS HF Analog Filters;" IEEE MELECON, pp. 39-42, May 2006.

* cited by examiner

*Primary Examiner*—Dinh T. Le
(74) *Attorney, Agent, or Firm*—Ladas & Parry LLP

(57) ABSTRACT

Provided are an apparatus for adjusting frequency characteristic and Q factor of a low pass filter (LPF) and a method thereof. The apparatus includes: a frequency comparing unit for calculating a first square value and a second square value, and comparing a first reference value with the first and the second square values; a frequency adjusting unit for adjusting the frequency characteristic to range the first reference value between the first square value and the second square value; a Q factor comparing unit for calculating a third square value, and comparing a second and a third reference values with the third square value; a control unit for activating the Q factor comparing unit when the frequency characteristic is completely adjusted; and a Q factor adjusting unit for adjusting the Q factor to range the third square value between the second reference value and the third reference value.

8 Claims, 9 Drawing Sheets

A : 234MHz
B : 260MHz
C : 286MHz

APPARATUS FOR ADJUSTING FREQUENCY CHARACTERISTIC AND Q FACTOR OF LOW PASS FILTER AND METHOD THEREOF

CROSS-REFERENCE TO RELATED APPLICATIONS

The present invention claims priority of Korean Patent Application No. 10-2006-0107884, filed on Nov. 2, 2006, which is incorporated herein by reference.

BACKGROUND OF THE INVENTION

1. Field of the Invention

The present invention relates to an apparatus for adjusting frequency characteristic and Q factor of a low pass filter and a method thereof; and, more particularly, to an apparatus for adjusting frequency characteristic and Q factor of a low pass filter that can improve filtering efficiency of the low pass filter (LPF) by adjusting the frequency characteristic and the Q factor according to a desired filtering function and a method thereof. The frequency characteristic and the Q factor are changed due to the variation of capacitance and resistance occurring when the LPF is implemented by an application specific integrated circuit (ASIC).

This work was supported by the Information Technology (IT) research and development program of the Korean Ministry of Information and Communication (MIC) and the Korean Institute for Information Technology Advancement (IITA) [2006-S-071-01, "Development of UWB Solution for High Speed Multimedia Transmission"].

2. Description of Related Art

Generally, a variety of elements are needed to construct a radio frequency (RF) transceiver which is implemented by an application of specific integrated circuit (ASIC). Among such elements, a low pass filter (LPF) for passing desired signal and eliminating undesired signal from received signal is an important part to determine the quality of the received signal.

However, values of resistors, capacitors and inductors included in the LFP are changed due to characteristics of ASIC fabrication. The Q factor and frequency characteristic, which are important performances of the LPF, are changed due to the above variation. Thus, characteristics of pass band and stop band of the LPF are changed so that the received signal is distorted.

Also, when a transceiver of a communication system is designed, the LPF is hard to design due to neighbor signals. Therefore, in order to improve characteristics of a receiver the broadness of the passband and insertion loss of the stopband must be enhanced by utilizing the frequency characteristic and the Q factor characteristic.

The principle of adjusting the frequency characteristic and the Q factor characteristic will be described hereinafter.

Generally, differential 2nd-order transfer function of the LPF, i.e., input-to-output ratio of the LPF, is expressed as the following Eq. 1.

$$T(s) = \frac{a_0}{S^2 + (\omega_0/Q)S + \omega_0^2} \quad \text{Eq. 1}$$

Herein, $a_0$ is a constant; S means a domain, i.e., $j\omega$; $\omega_0$ represent a frequency of the pass band; and Q means Q factor.

Herein, $\omega_0$ and Q determine a natural mode according to the following Eq. 2.

$$P_1, P_2 = -\frac{\omega_0}{2Q} \pm j\omega_0\sqrt{1 - (1/4Q^2)} \quad \text{Eq. 2}$$

Here, $\omega_0$ and Q determine characteristics of the LPF. In FIG. 6, when a value of the transfer function is the maximum value, $|T|_{MAX}$ and $\omega_{MAX}$, the frequency corresponding to $|T|_{MAX}$, are expressed as the following Eq. 3.

$$\omega_{MAX} = \omega_0\sqrt{1 - \frac{1}{2Q^2}}$$

$$T_{MAX} = \frac{a_0 Q}{\omega_0^2\sqrt{1 - \frac{1}{4Q^2}}} \quad \text{Eq. 3}$$

Here, a frequency having a magnitude of 3 dB smaller than the magnitude of $T_{MAX}$, i.e., 3 dB frequency, is expressed as the following Eq. 4. That is, in the following Eq. 4, the 3 dB frequency can be controlled by adjusting $\omega_0$ and Q.

$$\omega_1, \omega_2 = \omega_0\sqrt{1 + (1/4Q^2)} \pm \frac{\omega_0}{2Q} \quad \text{Eq. 4}$$

Herein, $BW = \omega_1 - \omega_2 = \omega_0/Q$. That is, as Q is increased, the bandwidth is decreased, and band-pass filter is getting more selective. That is, desired frequency range and selectiveness can be controlled by adjusting $\omega_0$ and Q.

Therefore, a method for adjusting the frequency characteristic and the Q factor of the LPF is needed based on the principle of adjusting the frequency characteristic and the Q factor.

SUMMARY OF THE INVENTION

An embodiment of the present invention is directed to providing an apparatus for adjusting frequency characteristic and Q factor of a low pass filter that can improve filtering efficiency of the low pass filter (LPF) by adjusting the frequency characteristic and the Q factor according to a desired filtering function and a method thereof. The frequency characteristic and the Q factor are changed due to the variation of capacitance and resistance occurring when the LPF is implemented by an application specific integrated circuit (ASIC).

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an aspect of the present invention, there is provided an apparatus for adjusting frequency characteristic and Q factor of a low pass filter (LPF), including: a frequency comparing unit for calculating a first square value and a second square value by integrating a first frequency band signal and a second frequency band signal, and comparing a first reference value with a first square value and a second square value; a frequency adjusting unit for adjusting the frequency characteristic of the LPF to range the first reference value between the first square value and the second square value; a Q factor comparing unit for calculating a third square value by integrating a third frequency band signal, and comparing a second reference value and a third reference value with the third square value; a control unit for activating the Q factor comparing unit when the frequency characteristic is completely adjusted; and a Q factor adjusting unit for adjusting the Q factor of the LPF to range the third square value between the second reference value and the third reference value.

In accordance with another aspect of the present invention, there is provided a method for adjusting frequency characteristic and Q factor of a LPF, including: calculating a first square value and a second square value by integrating a first frequency band signal and a second frequency band signal, and comparing a first reference value with the first square value and the second square value; adjusting the frequency characteristic of the LPF to range the first reference value between the first square value and the second square value; calculating a third square value by integrating a third frequency band signal, and comparing a second reference value and a third reference value with the third square value; and adjusting the Q factor of the LPF to range the third square value between the second reference value and the third reference value.

DESCRIPTION OF SPECIFIC EMBODIMENTS

The advantages, features and aspects of the invention will become apparent from the following description of the embodiments with reference to the accompanying drawings, which is set forth hereinafter.

Figure 1:
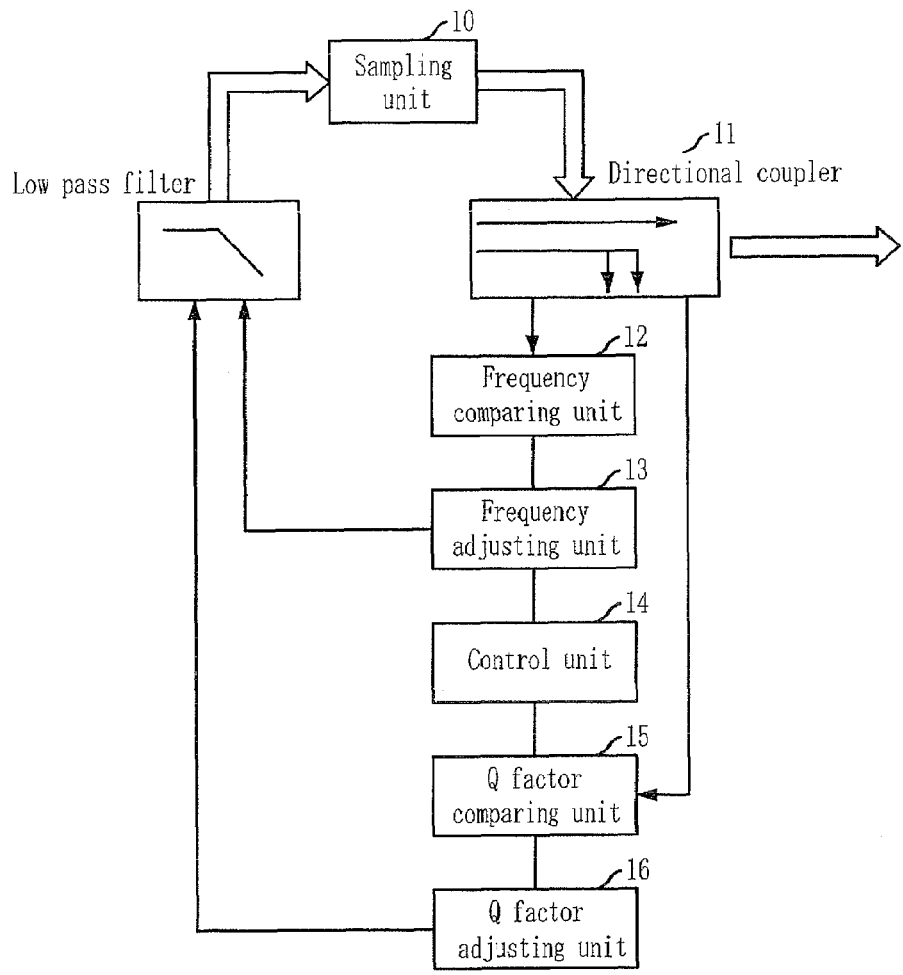
FIG. 1 is a block diagram illustrating an apparatus for adjusting frequency characteristic and Q factor of a low pass filter in accordance with an embodiment of the present invention.

FIG. 1 is a block diagram illustrating an apparatus for adjusting frequency characteristic and Q factor of a low pass filter in accordance with an embodiment of the present invention.

As shown in FIG. 1, the apparatus for adjusting the frequency characteristic and the Q factor of the LPF includes a sampling unit 10, a directional coupler 11, a frequency comparing unit 12, a frequency adjusting unit 13, a control unit 14, a Q factor comparing unit 15 and a Q factor adjusting unit 16.

The sampling unit 10 samples an output signal of the LPF. The directional coupler 11 performs coupling the sampling signal sampled in the sampling unit 10.

The frequency comparing unit 12 extracts a first frequency band signal by multiplying a first frequency ($f_0$) by the coupled sampling signal in the directional coupler 11, and calculates a first square value of the extracted first frequency band signal. Also, the frequency comparing unit 12 extracts a second frequency band signal by multiplying a second frequency ($f_0+\Delta f$) by the coupled sampling signal in the directional coupler 11, and calculates a second square value of the extracted second frequency band signal. Then, the frequency comparing unit 12 compares the first square value and the second square value with a first reference value, respectively.

The frequency adjusting unit 13 adjusts the frequency characteristic of the LPF based on a comparison result of the frequency comparing unit 12 to have the first reference value come between the first square value and the second square value. The control unit 14 activates the Q factor comparing unit 15 when the frequency adjusting unit 13 completes the adjustment of the frequency characteristic.

The Q factor comparing unit 15 extracts a third frequency band signal by multiplying a third frequency ($f_n$) by the coupled sampling signal in the directional coupler 11, calculates a third square value of the extracted third frequency band signal, compares the third square value with a second reference value and a third reference value, respectively. The Q factor adjusting unit 16 adjusts the Q factor of the LPF based on a comparison result of the Q factor comparing unit 15 to have the third square value come between the second reference value and the third reference value.

A method for adjusting the frequency characteristic and the Q factor of the LPF will be described hereinafter.

First, the first frequency band signal is extracted by multiplying the first frequency ($f_0$) by the coupled sampling signal in the directional coupler 11, and the first square value is calculated. Also, the second frequency band signal is extracted by multiplying the second frequency ($f_0+\Delta f$) by the coupled sampling signal in the directional coupler 11, and the second square value is calculated.

Second, the frequency characteristic of the LPF is adjusted in such a manner that the first reference value comes between the first square value and the second square value.

Third, when the adjustment of the frequency characteristic is completed, the third frequency band signal is extracted by multiplying the third frequency ($f_n$) by the coupled sampling signal in the directional coupler 11, and the third square value is calculated.

Fourth, the Q factor of the LPF is adjusted in such a manner that the third square value comes between the second reference value and the third reference value.

As described above, the frequency characteristic and the Q factor of the LPF can be adjusted.

In reference to FIGS. 2 and 3a to 3e, the frequency comparing unit 12 will be described in detail hereinafter.

Figure 2:
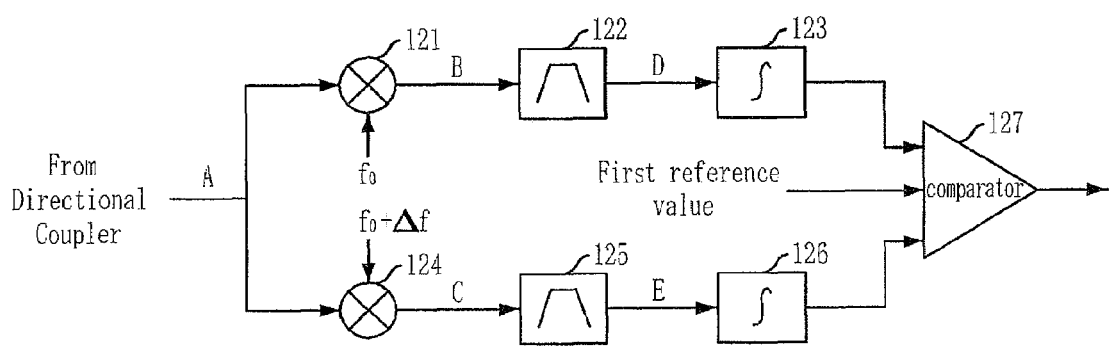
FIG. 2 is a block diagram illustrating a frequency comparing unit in accordance with an embodiment of the present invention.

As shown in FIG. 2, the frequency comparing unit 12 includes a first multiplier 121, a first band pass filter (BPF) 122, a first integrator 123, a second multiplier 124, a second band pass filter (BPF) 125, a second integrator 126 and a first comparator 127.

Figure 3A:
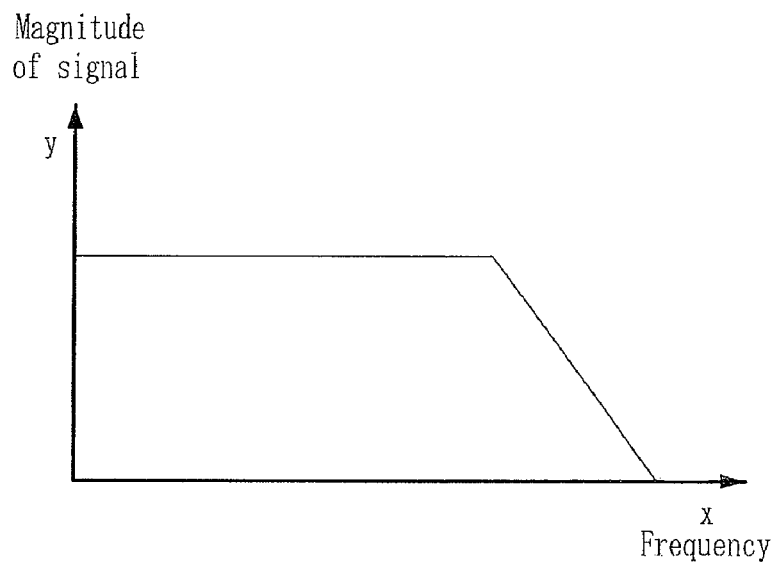
FIGS. 3a to 3e are graphs showing signal waveforms at measurement points of the frequency comparing unit in accordance with an embodiment of the present invention.
Figure 3B:
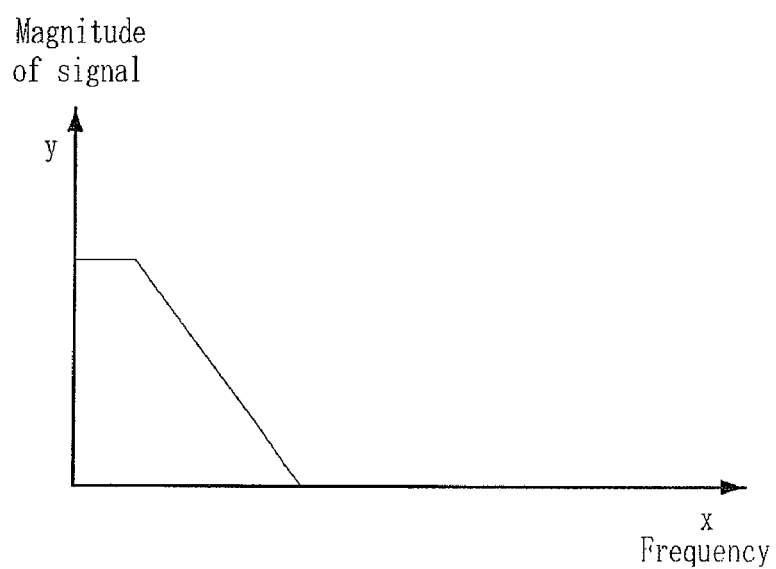
Figure 3C:
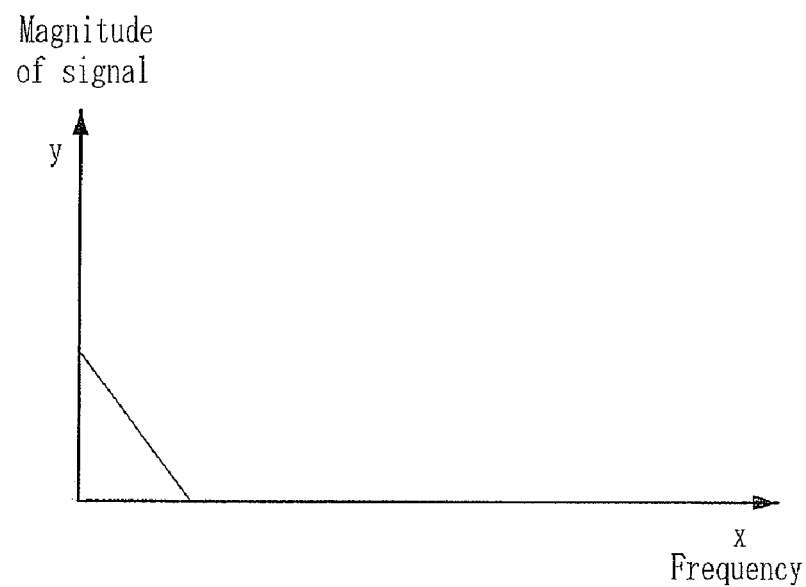
Figure 3D:
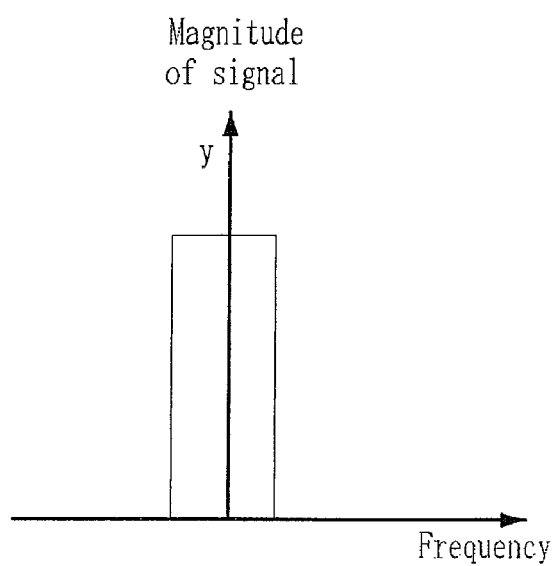
Figure 3E:
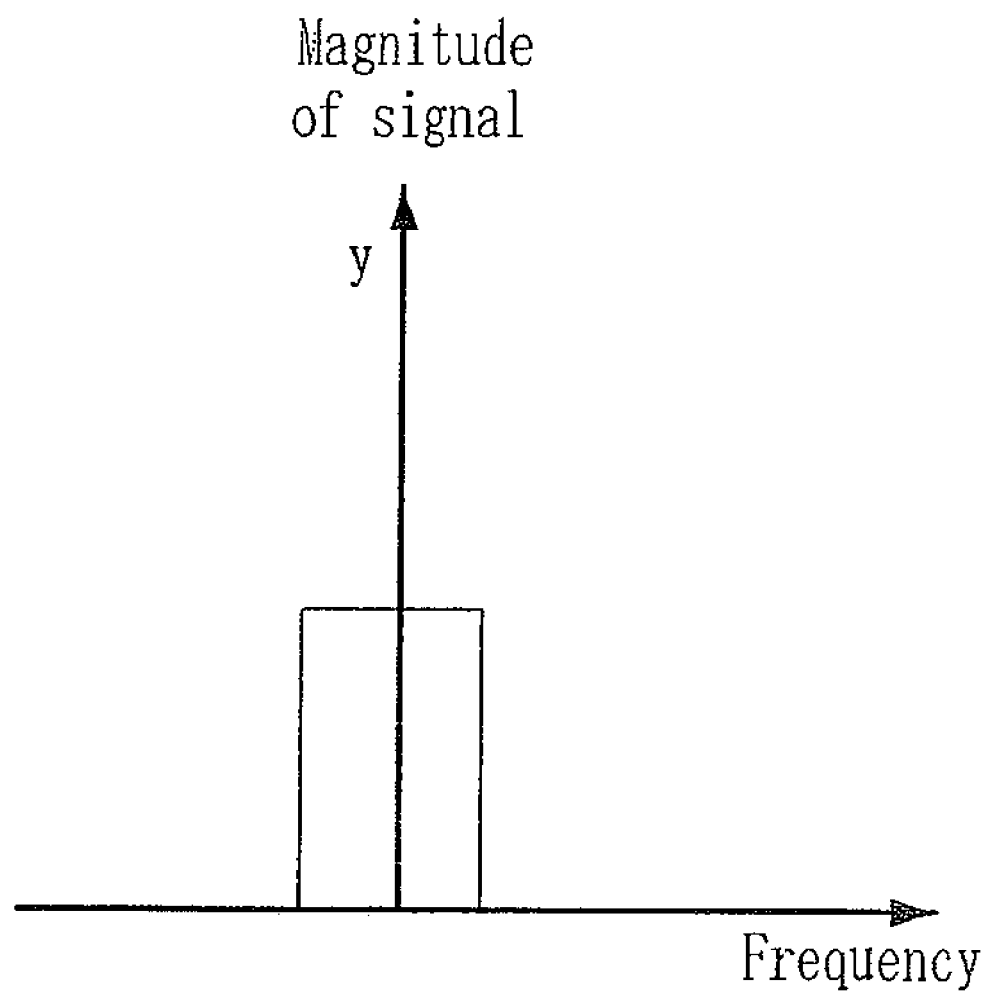

The first multiplier 121 multiplies a first frequency ($f_0$) by a sampling signal, i.e., 'A' shown in FIG. 3a, which coupled in the directional coupler 11. The first BPF 122 extracts a first frequency band signal, i.e., 'D' shown in FIG. 3d, from an output signal, i.e., 'B' shown in FIG. 3b, of the first multiplier 121. The first integrator 123 calculates a first square value of the first frequency band signal extracted in the first BPF 122.

The second multiplier 124 multiplies a second frequency ($f_0+\Delta f$) by the sampling signal, i.e., 'A' shown in FIG. 3a, which coupled in the directional coupler 11. The second BPF 125 extracts a second frequency band signal, i.e., 'E' shown in FIG. 3e, from an output signal, i.e., 'C' shown in FIG. 3c, of the second multiplier 124. The second integrator 126 calculates a second square value of the second frequency band signal extracted in the second BPF 125.

The first comparator 127 compares a first reference value with the first square value calculated in the first integrator 123 and the second square value calculated in the second integrator 126, respectively.

Hereinafter, referring to FIGS. 4 and 5a to 5c, the Q factor comparing unit 15 will be described in detail.

Figure 4:
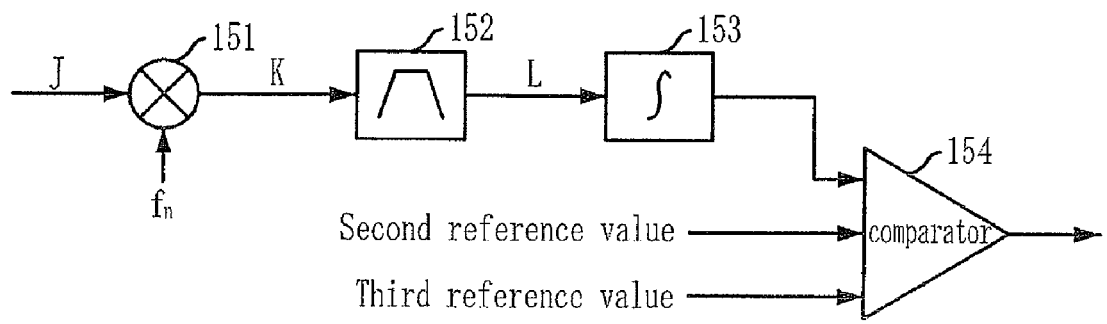
FIG. 4 is a block diagram illustrating a Q factor comparing unit in accordance with an embodiment of the present invention.

As shown in FIG. 4, the Q factor comparing unit 15 includes a third multiplier 151, a third band pass filter (BPF) 152, a third integrator 153 and a second comparator 154.

Figure 5A:
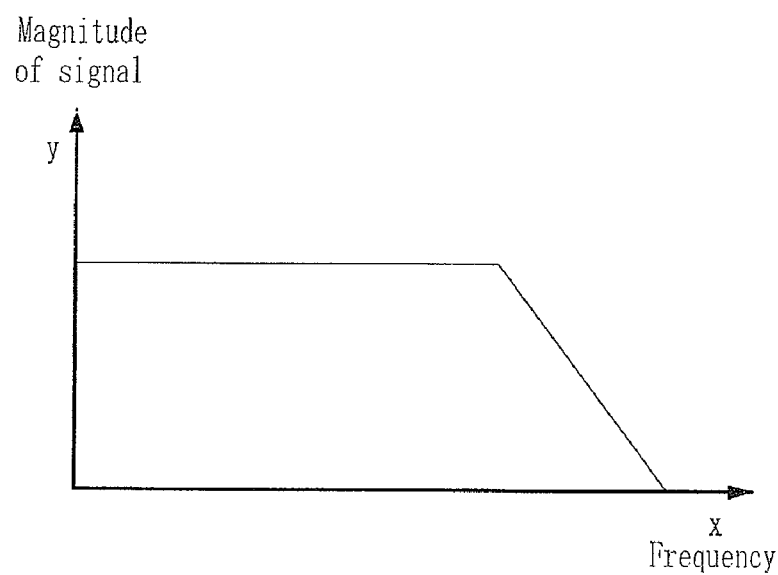
FIGS. 5a to 5c are graphs showing signal waveforms at measurement points of the Q factor comparing unit in accordance with an embodiment of the present invention.
Figure 5B:
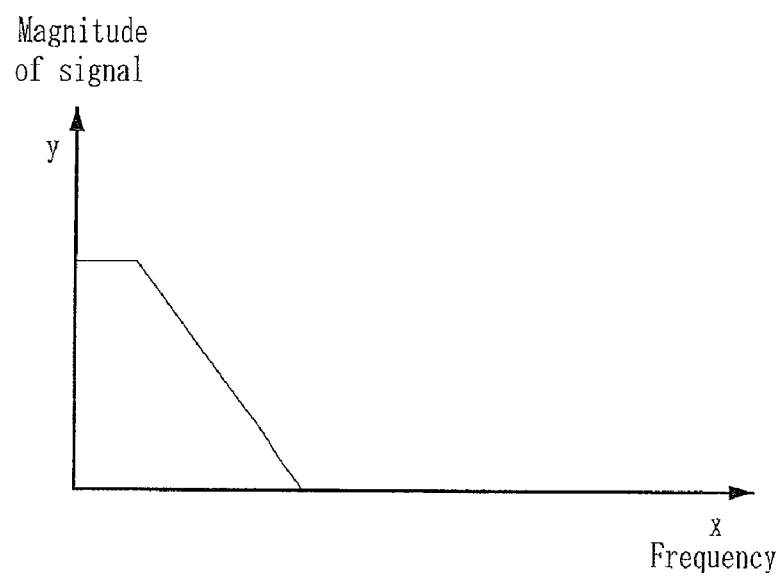
Figure 5C:
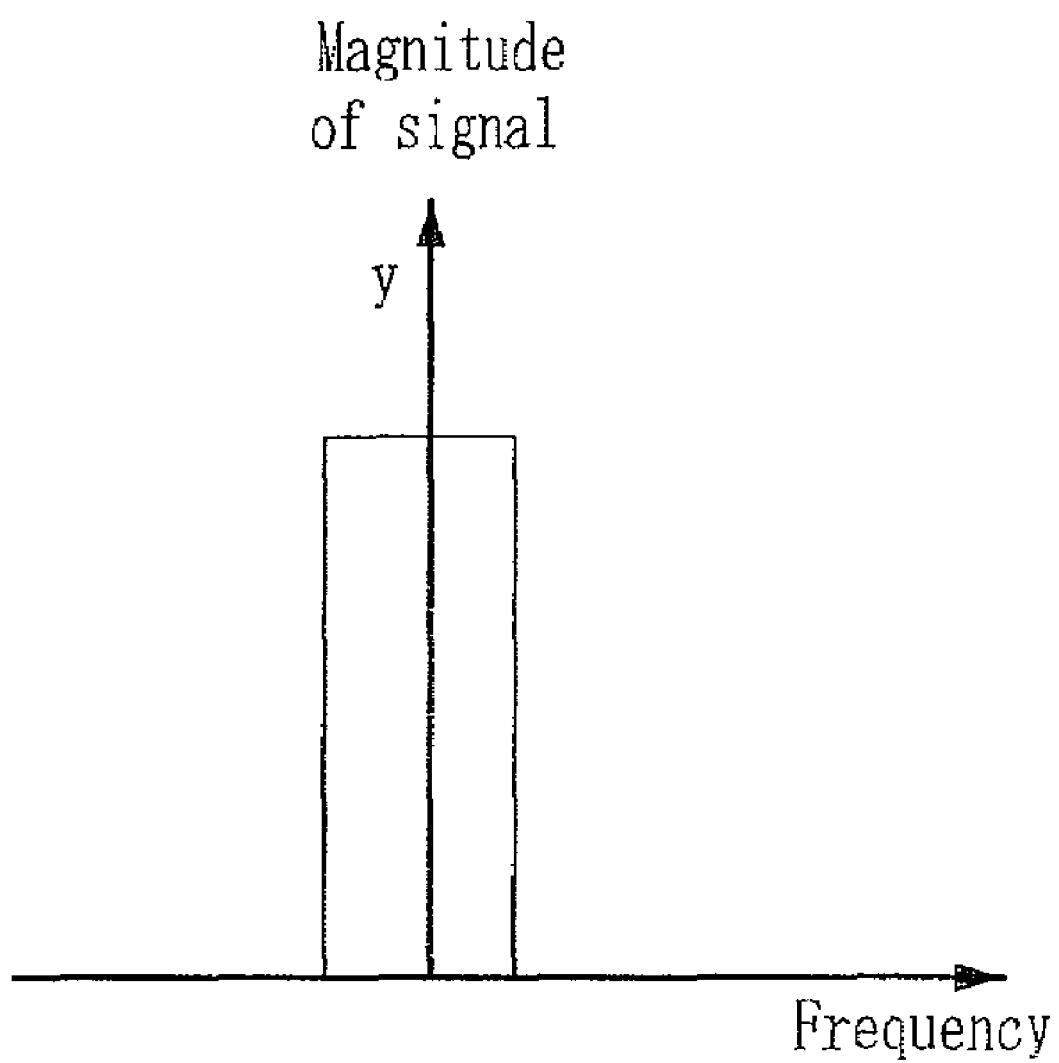

The third multiplier 151 multiplies a third frequency ($f_n$) by a sampling signal, i.e., 'J' shown in FIG. 5a, which coupled in the directional coupler 11. The third BPF 152 extracts a third frequency band signal, i.e., 'L' shown in FIG. 5c, from an output signal, i.e., 'K' shown in FIG. 5b, of the third multiplier 151. The third integrator 153 calculates a third square value of the third frequency band signal extracted in the second BPF 152. The second comparator 154 compares a third square value calculated in the third integrator 153 with a second reference value and a third reference value, respectively.

The above steps for adjusting the frequency characteristic and the Q factor of the LPF are repeated to satisfy a predetermined condition.

Figure 6:
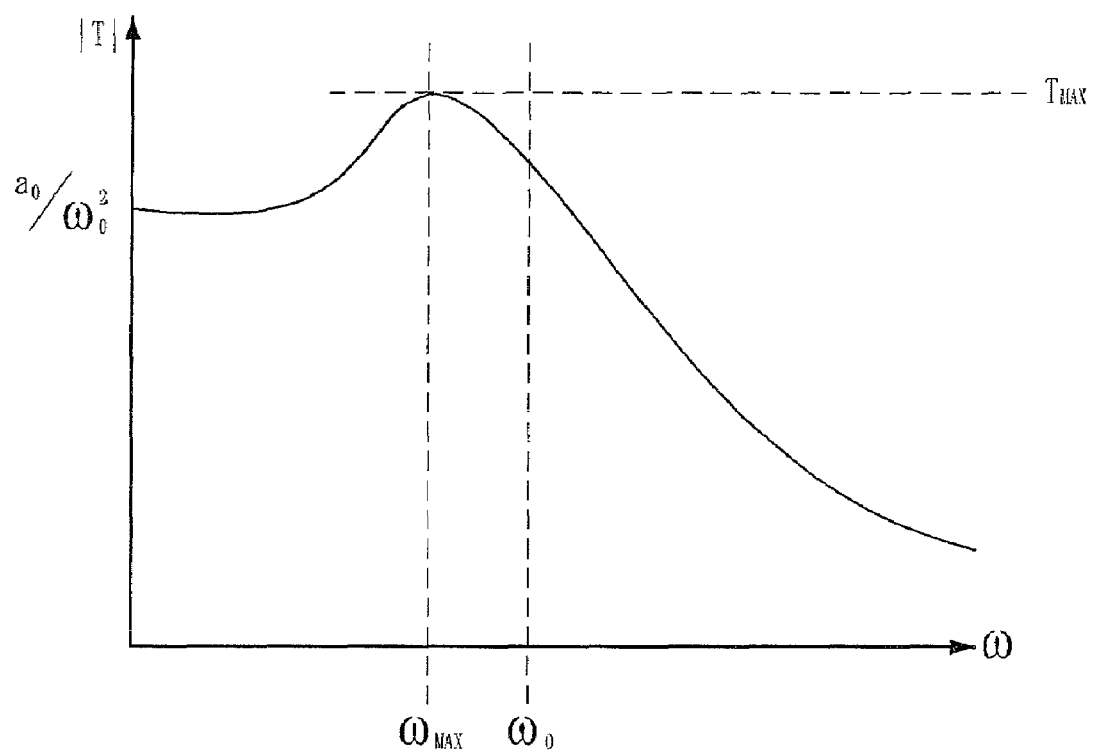
FIG. 6 is a graph showing Q factor characteristic which is applied to the present invention.

FIG. 6 is a graph showing Q factor characteristic which is applied to the present invention.

As shown in FIG. 6, the Q factor represents a peak or a trough of the graph.

Figure 7:
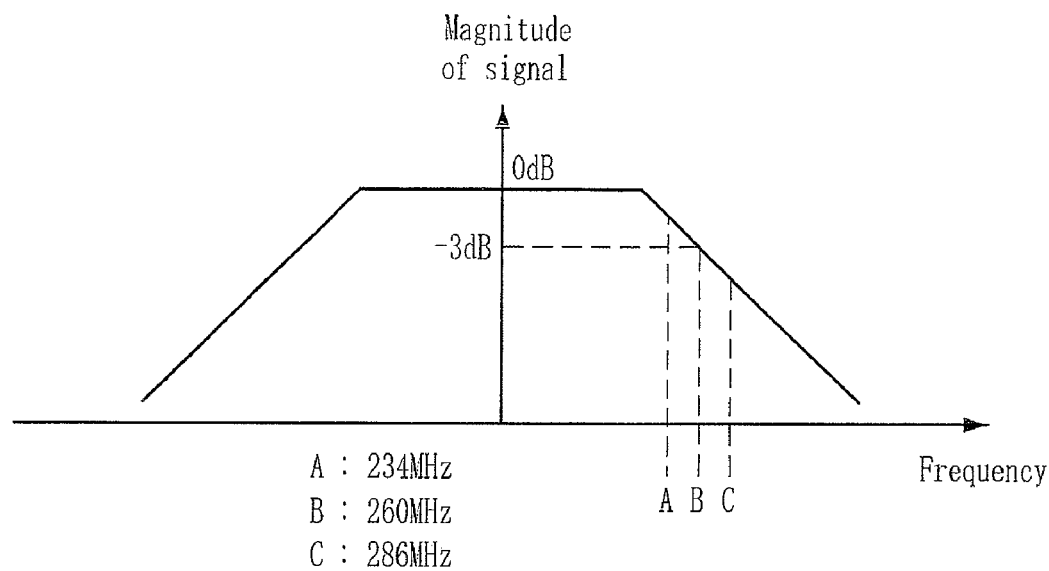
FIG. 7 is a graph showing filter characteristic of MB-OFDM UWB in accordance with the present invention.

FIG. 7 is a graph showing filter characteristic of MB-OFDM UWB in accordance with the present invention.

Here, target frequency is 260 MHz; $f_0+\Delta f$ is 286 MHz; and $f_0$ is 234 MHz. Therefore, the first reference value is −3 dB, i.e., the gain characteristic of the low pass filter at B point.

Figure 8:
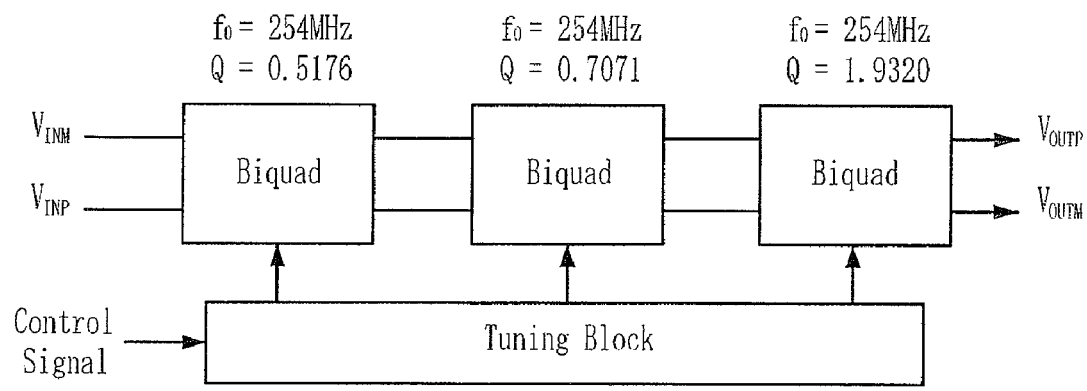
FIG. 8 is a block diagram illustrating a filter used in ultra wideband (UWB) in accordance with an embodiment of the present invention.

FIG. 8 is a block diagram illustrating filter used in ultra wideband (UWB) in accordance with an embodiment of the present invention.

Here, Q factor of each 'Biquad' LPF is 0.5176, 0.7071 and 1.9320, respectively. The second reference value and the third reference value are determined by +/−10% of each Q factor.

That is, in case of a first Biquad filter, $f_0$ is 254 MHz; the second reference value is 0.5176(1−0.1), i.e., 0.46584; and the third reference value is 0.5176(1+0.1), i.e., 0.56936.

As described above, the present invention can improve filtering performance of the low pass filter by adjusting the frequency characteristic and the Q factor according to a desired filtering characteristic. The frequency characteristic and the Q factor which are changed based on variation of capacitance and resistance occur when the low pass filter is implemented with application specific integrated circuit (ASIC).

The above described method according to the present invention can be embodied as a program and be stored on a computer readable recording medium. The computer readable recording medium is any data storage device that can store data which can be read by the computer system. The computer readable recording medium includes a read-only memory (ROM), a random-access memory (RAM), a CD-ROM, a floppy disk, a hard disk and an optical magnetic disk.

While the present invention has been described with respect to the specific embodiments, it will be apparent to those skilled in the art that various changes and modifications may be made without departing from the spirit and scope of the invention as defined in the following claims.

What is claimed is:

1. An apparatus for adjusting frequency characteristic and Q factor of a low pass filter (LPF), comprising:
   a frequency comparing unit comparing a first reference value with a first square value and a second square value, wherein the first square value and the second square value are generated by integrating a first frequency band signal and a second frequency band signal;
   a frequency adjusting unit for adjusting the frequency characteristic of the LPF according to an output signal of the frequency comparing unit such that the first reference value falls within a range between the first square value and the second square value;
   a control unit for activating a Q factor comparing unit according to an output signal of the frequency adjusting unit indicating that a frequency characteristic is completely adjusted; and
   the Q factor comparing unit comparing a third square value with a second reference value and a third reference value according to an output signal of the control unit, wherein the third square value is generated by integrating a third frequency band signal;
   a Q factor adjusting unit for adjusting the Q factor of the LPF according to an output signal of the Q factor comparing unit such that the third square value falls within a range between the second reference value and the third reference value.

2. The apparatus of claim 1, wherein the first frequency band signal is extracted by multiplying a first frequency ($f_o$) by a sampling signal coupled in a directional coupler, and the second frequency band signal is extracted by multiplying a second frequency ($f_o+\Delta f$) by the sampling signal.

3. The apparatus of claim 2, wherein the third frequency band signal is extracted by multiplying a third frequency ($f_n$) by the sampling signal.

4. The apparatus of claim 2, wherein the frequency comparing unit comprises:
   a first multiplier for multiplying the sampling signal by the first frequency ($f_o$);
   a first band pass filter (BPF) for extracting the first frequency band signal from an output signal of the first multiplier;
   a first integrator for generating the first square value of the first frequency band signal extracted in the first BPF;
   a second multiplier for multiplying the sampling signal by the second frequency ($f_o+\Delta f$);
   a second BPF for extracting the second frequency band signal from an output signal of the second multiplier;
   a second integrator for generating the second square value of the second frequency band signal extracted in the second BPF; and
   a first comparator for comparing the first reference value with the first square value generated in the first integrator and the second square value generated in the second integrator.

5. The apparatus of claim 3, wherein the Q factor comparing unit comprises:
   a third multiplier for multiplying the sampling signal by the third frequency ($f_n$);
   a third band pass filter (BPF) for extracting the third frequency band signal from an output signal of the third multiplier;
   a third integrator generating the third square value of the third frequency band signal extracted in the third BPF; and a second comparator for comparing the second reference value and the third reference value with the third square value generated in the third integrator.

6. A method for adjusting frequency characteristic and Q factor of a low pass filter (LPF), comprising:

generating a first square value and a second square value by integrating a first frequency band signal and a second frequency band signal, and comparing a first reference value with the first square value and the second square value;

adjusting the frequency characteristic of the LPF according to the comparison of the first reference value with the first square value and the second square value such that the first reference value falls within a range between the first square value and the second square value;

generating a third square value by integrating a third frequency band signal, and comparing a second reference value and a third reference value with the third square value; and adjusting the Q factor of the LPF according to the comparison of the second reference value and the third reference value with the third square value such that the third square value falls within a range between the second reference value and the third reference value.

7. The method of claim 6, wherein the generating the first square value and the second square value comprises:

extracting the first frequency band signal by multiplying a first frequency ($f_o$) by a sampling signal coupled in a directional coupler; and extracting the second frequency band signal by multiplying a second frequency ($f_o + \Delta f$) by the sampling signal.

8. The method of claim 7, wherein the generating the third square value comprises extracting the third frequency band signal by multiplying a third frequency ($f_n$) by the sampling signal.

* * * * *